United States Patent
Biran et al.

(10) Patent No.: US 8,838,544 B2
(45) Date of Patent: Sep. 16, 2014

(54) FAST HISTORY BASED COMPRESSION IN A PIPELINED ARCHITECTURE

(75) Inventors: Giora Biran, Zichron-Yaakov (IL); Amit Golander, Tel Aviv (IL)

(73) Assignee: International Business Machines Corporation, Armonk, NY (US)

( * ) Notice: Subject to any disclaimer, the term of this patent is extended or adjusted under 35 U.S.C. 154(b) by 792 days.

(21) Appl. No.: 12/565,194

(22) Filed: Sep. 23, 2009

(65) Prior Publication Data

US 2011/0071990 A1 Mar. 24, 2011

(51) Int. Cl.
- G06F 7/00 (2006.01)
- G06F 17/00 (2006.01)
- G06F 17/30 (2006.01)
- H03M 7/30 (2006.01)

(52) U.S. Cl.
CPC ....... H03M 7/3086 (2013.01); G06F 17/30353 (2013.01)
USPC .......................... 707/674; 707/693; 707/682

(58) Field of Classification Search
CPC .............................................. G06F 17/30353
USPC ......... 707/899; 708/210; 341/63, 67, 51, 107; 711/170; 370/474, 458; 716/4, 136; 712/214, 217, 218, 220; 713/400; 709/228

See application file for complete search history.

(56) References Cited

U.S. PATENT DOCUMENTS

| | | | | |
|---|---|---|---|---|
| 4,701,745 A * | 10/1987 | Waterworth | ..................... | 341/63 |
| 5,016,009 A * | 5/1991 | Whiting et al. | .................. | 341/67 |
| 5,121,390 A * | 6/1992 | Farrell et al. | .................. | 370/458 |
| 5,197,132 A * | 3/1993 | Steely et al. | .................. | 712/217 |
| 5,293,379 A * | 3/1994 | Carr | ............................... | 370/474 |
| 5,369,605 A * | 11/1994 | Parks | ............................. | 708/210 |
| 5,778,255 A | 7/1998 | Clark et al. | | |
| 5,867,114 A * | 2/1999 | Barbir | ........................... | 341/107 |
| 6,043,765 A | 3/2000 | Twardowski | | |
| 6,145,069 A * | 11/2000 | Dye | .............................. | 711/170 |
| 6,208,273 B1 * | 3/2001 | Dye et al. | ........................ | 341/51 |
| 6,693,567 B2 | 2/2004 | Cockburn | | |
| 7,071,854 B1 | 7/2006 | Cardosa et al. | | |
| 7,129,860 B2 | 10/2006 | Alvarez | | |
| 7,190,284 B1 * | 3/2007 | Dye et al. | ........................ | 341/51 |
| 7,302,661 B2 * | 11/2007 | Beattie et al. | ................. | 716/136 |
| 7,398,375 B2 * | 7/2008 | Ernst et al. | .................... | 712/217 |
| 8,005,966 B2 * | 8/2011 | Pandya | ........................ | 709/228 |
| 8,296,550 B2 * | 10/2012 | Glew | ............................ | 712/220 |
| 2002/0069375 A1 * | 6/2002 | Bowen | ......................... | 713/400 |
| 2002/0083297 A1 * | 6/2002 | Modelski et al. | ............... | 712/18 |
| 2007/0083735 A1 * | 4/2007 | Glew | ............................ | 712/214 |
| 2008/0115096 A1 * | 5/2008 | Pikus | ................................ | 716/4 |
| 2010/0070742 A1 * | 3/2010 | Dowling | ....................... | 712/225 |

\* cited by examiner

*Primary Examiner* — Susan Chen

(74) *Attorney, Agent, or Firm* — Robert R. Williams; Eyal Gilboa

(57) ABSTRACT

A novel and useful system and method of fast history compression in a pipelined architecture with both speculation and low-penalty misprediction recovery. The method of the present invention speculates that a current input byte does not continue an earlier string, but either starts a new string or represents a literal (no match). As previous bytes are checked if they start a string, the method of the present invention detects if speculation for the current byte is correct. If speculation is not correct, then various methods of recovery are employed, depending on the repeating string length.

19 Claims, 6 Drawing Sheets

FAST HISTORY BASED COMPRESSION IN A PIPELINED ARCHITECTURE

FIELD OF THE INVENTION

The present invention relates to the field of data compression, and more particularly relates to method and mechanism for implementing a fast history based compression suitable for implementation in a pipelined architecture.

BACKGROUND

History based compression systems achieve compression by replacing portions of the data with references to matching data that have already been read by the system. A match is encoded by a pair of numbers called a length-distance pair, where each of the next length characters is equal to the character exactly distance characters behind it in the uncompressed stream.

The system keeps track of some amount of the most recent data, such as the last 2 kilobytes (kB), 4 kB, or 32 kB. The structure in which this data is held is called a sliding window or a history table. The system needs to keep this data to look for matches, and to keep this data to interpret any identified matches.

SUMMARY OF THE INVENTION

There is thus provided in accordance with the invention, a method of speculation in a compression system, the method comprising the steps of initiating a first sequence of a plurality of compression operations by the compression system on a first subset of data to be compressed and initiating a second sequence of the plurality of compression operations by the compression system on a second subset of said data to be compressed, wherein the second sequence is started before a match is identified in the first sequence by the compression system.

There is also provided in accordance of the invention, a method of compression misprediction recovery in a compression system, the method comprising the steps of calculating, in a first sequence of compression operations performed in the compression system, a match between a subset of data to be compressed and a history table, identifying a plurality of subsequent sequences of compression operations performed in the data compression system, the plurality of subsequent sequences attempting to compress any bytes contained in said dataset and ignoring any results from the identified plurality of subsequent sequences.

There is further provided in accordance of the invention, a system comprising a speculation module, operative to retrieve a plurality of subsets of a data to be analyzed for compression and a compression module, operative to identify a match, the match comprising a length distance pair between a most recent of the retrieved subsets and a second subset in a history table retrieved prior to the most recent retrieved subset, wherein the speculation module retrieves one or more subsequent subsets prior to the compression module identifying the match for the most recent retrieved subset.

There is also provided in accordance of the invention, a system comprising a read module, operative to retrieve multiple subsequent subsets of data to be compressed a compression module, operative to find a match between one of the multiple subsets and a subset in a history table and a misprediction recovery module, operative to identify one or more of the multiple subsets retrieved subsequent to the match, wherein the identified one or more subsets containing one or more bytes of the data to be compressed identical to any byte in the match.

BRIEF DESCRIPTION OF THE DRAWINGS

The invention is herein described, by way of example only, with reference to the accompanying drawings, wherein.

DETAILED DESCRIPTION OF THE INVENTION

Notation Used Throughout

The following notation is used throughout this document:

| Term | Definition |
| --- | --- |
| kB | Kilo Bytes |
| DRAM | Dynamic Random Access Memory |
| RA | Register Array |
| SRAM | Static Random Access Memory |

Overview

The present invention provides a method of fast history compression in a pipelined architecture with both speculation and low-penalty misprediction recovery. The method of the present invention speculates that a current input byte does not continue an earlier string, but either starts a new string or represents a literal (no match). As previous bytes are checked if they start a string, the method of the present invention detects if speculation for the current byte is correct. If speculation is not correct, then various methods of recovery are employed, depending on the repeating string length.

The present invention is operative to aid in the design of faster hardware based compression systems which can execute instructions at high frequency. Since the method of the present invention compresses short, medium and long strings, performance will average greater than one input byte per cycle. This is due to a weighted average of the clock cycles required to compress literals (one byte/cycle), short strings (one byte/cycle), and medium and large strings (greater than one byte/cycle).

Fast History Compression

As discussed supra, the present invention provides a method of speculation and misprediction recovery for compression systems implementing a pipelined architecture. As one of the stages in the instruction pipeline is a read operation, speculation is accomplished by starting subsequent reads before a match is detected for a prior read operation and data in a history buffer (the history buffer is a queue containing a specific amount of recently read data). Once a match has been found, misprediction recovery flags any data that is currently in the pipeline and was identified as a match. The data is flagged to be ignored by the compression system.

Figure 1:
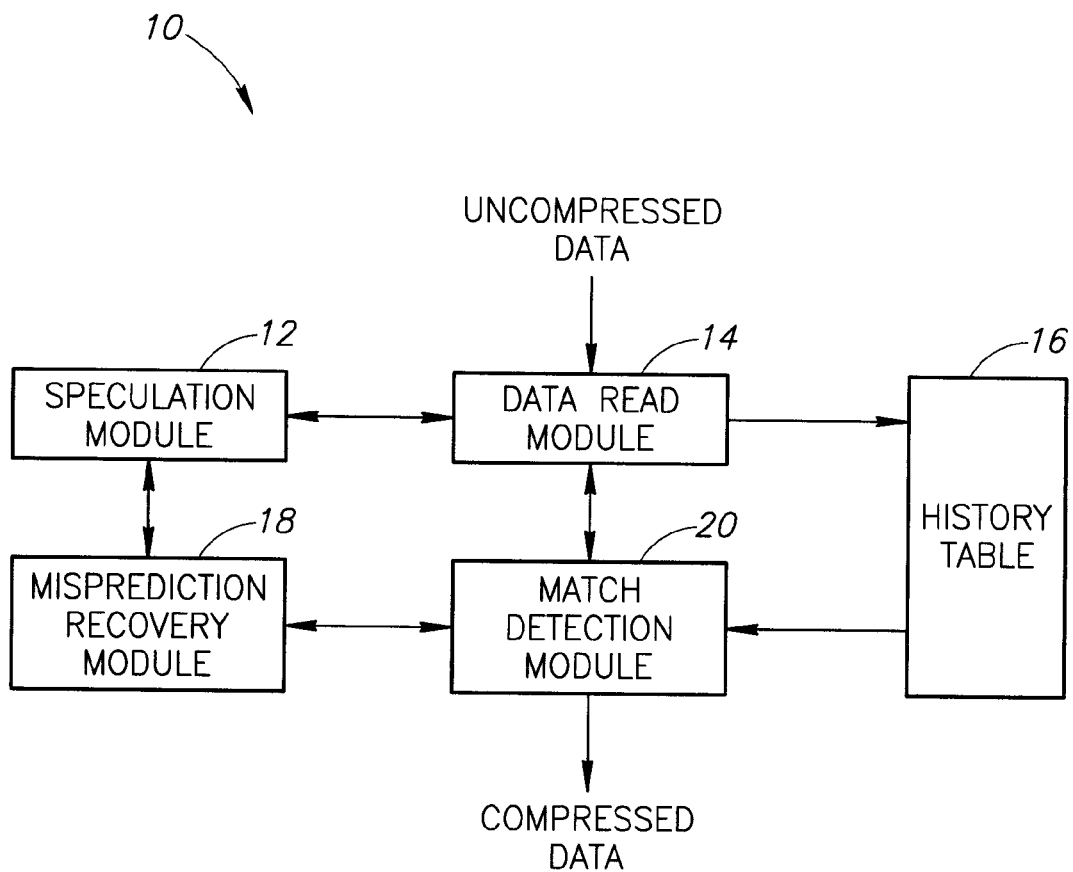
FIG. 1 is a block diagram illustrating an example implementation of the fast history compression method in accordance with an embodiment of the present invention.

A block diagram illustrating an example implementation of the fast history compression method in accordance with an embodiment of the present invention is shown in FIG. 1. The compression system, generally referenced 10, comprises a speculation module 12, a data read module 14, a history table 16, a misprediction recovery module 18 and a match detection module 20. In operation, speculation module 12 instructs data read module 14 what data to read (i.e. position and length in the input data). After data read module 14 reads data, it updates history table 16 with the data, and sends the data to match detection module 20. History table 16 is typically implemented as either a Static Random Access Memory (SRAM) array, a Dynamic Access Memory (DRAM) array or a Register array (RA).

If match detection module 20 detects a match between read data and history table 16, it calculates a length distance pair, which comprises the compressed data. Once a match is detected, match detection module 20 determines the length of the match by comparing additional data received from data read module with data in the history table subsequent to the initial match. One a match is detected, misprediction recovery module 18 flushes any read data in the pipeline that was included in the current match, and if necessary, instructs speculation module 12 where to perform the next read operation (i.e. location in the uncompressed data)

For short strings whose length L<=X (X depends on pipeline structure, for example X=4), some of the speculative stages are false (i.e. L=|string length|), but the rest could still be true and should not be discarded. In this case, the method of the present invention selectively flushes L−1 false pipeline stages, and returns to the L+1 byte (its speculation was correct, so no time was lost). Performance for matching short strings processes L input bytes in L cycles.

For medium length strings (i.e. whose length L>X, but still within a single history buffer line), the method of the present invention flushes the pipeline, calculates the address for the next input byte and instructs speculation module 18 to start the next read at that point. Performance for medium strings processes L input bytes in X cycles (i.e. greater than one input byte per cycle).

For long strings (i.e. whose length exceed a single history buffer line), the method of the present invention executes a repeating search pattern mode. Performance in this case is even better than medium, approximately buffer width (W)*number of Hits (H) in X+H cycles. This is usually much greater than one, as a typical value for W is 16 bytes long.

Figure 2:
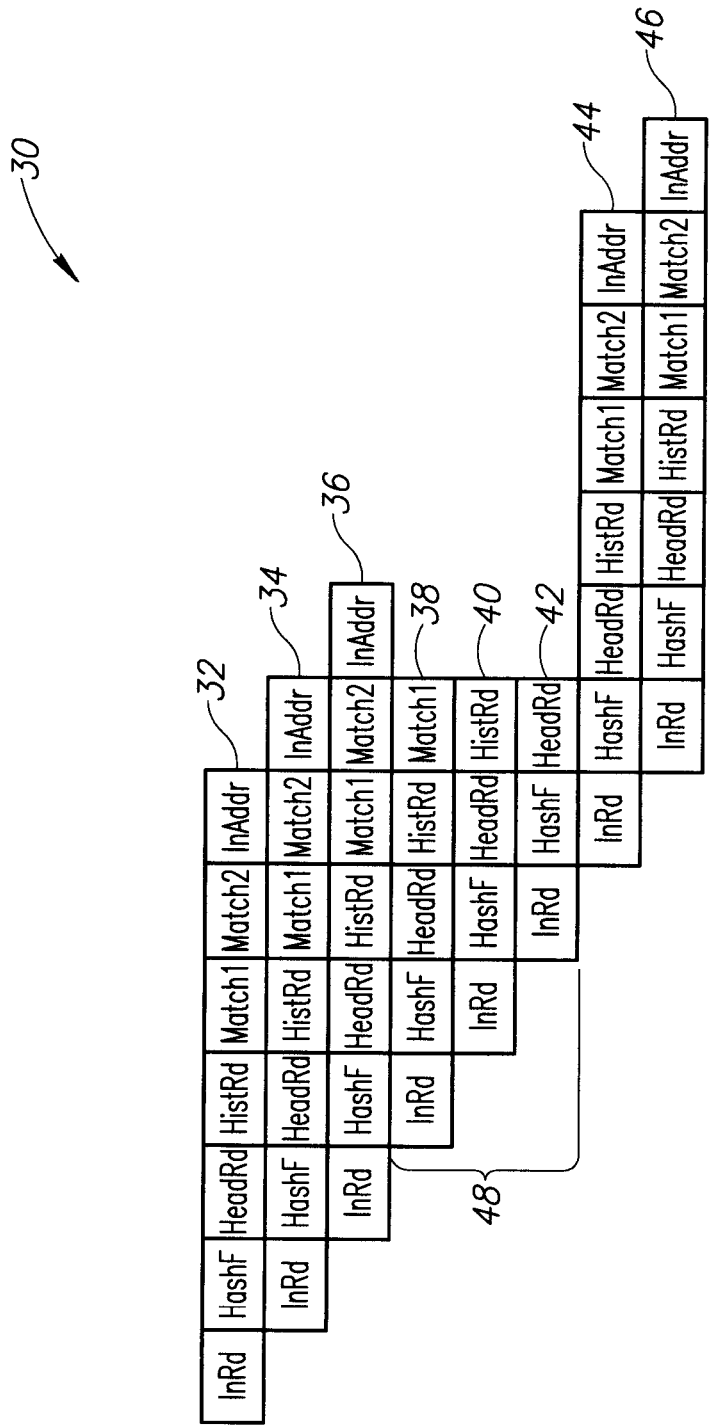
FIG. 2 is a block diagram illustrating a short string match in an instruction pipelined system implementing the fast history compression method in accordance with an embodiment of the present invention.
Figure 3:
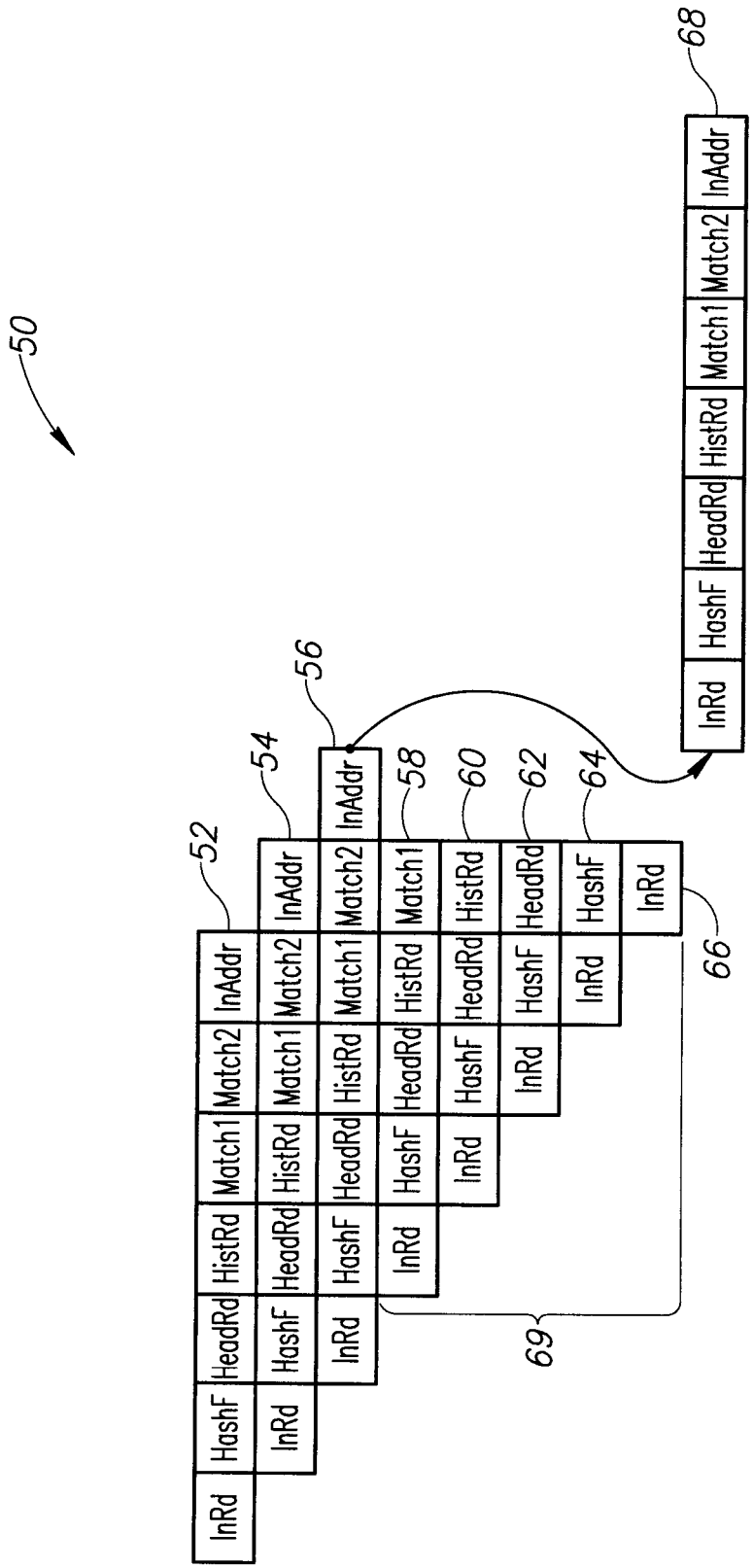
FIG. 3 is a block diagram illustrating a medium string match in an instruction pipelined system implementing the fast history compression method in accordance with an embodiment of the present invention.
Figure 4:
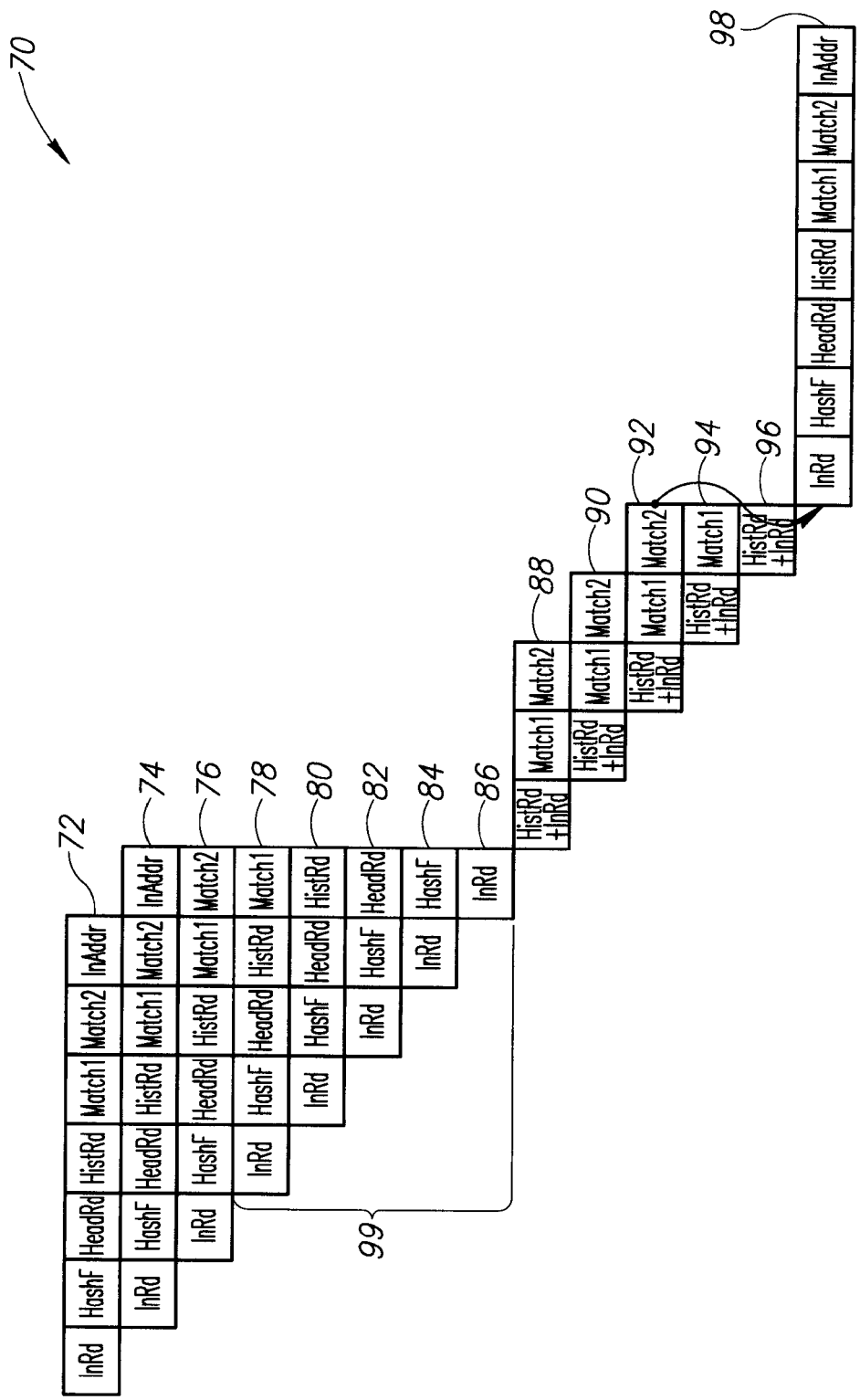
FIG. 4 is a block diagram illustrating a long string match in an instruction pipelined system implementing the fast history compression method in accordance with an embodiment of the present invention.

FIGS. 2, 3 and 4 are block diagrams illustrating string matches in an instruction pipelined system implementing the fast history compression method in accordance with an embodiment of the present invention. The instruction pipeline for these examples comprises the following stages (i.e. corresponding to clock cycles): (1) Shift the input stream to align with the current byte. This stage positions the read window (a fixed number of bytes, in this case three) to the current input address. (2) Calculate a hash function for the data in the read window. (3) Locate the appropriate position in the hash table for the calculated value. (4) Read the history table. (5, 6) Compare the data in the read window to the data in the history table to find a match. If a match exists, determine the length L of the match (i.e. identical subsequent bytes in both the input stream and the history table, up to the width of the history table). (7) Calculate a new input stream address if there was a match, otherwise advance the input stream by one byte (e.g., if bytes 10, 11 and 12 were read previously, advance the input stream so that bytes 11, 12 and 13 will be read). FIGS. 2, 3 and 4 refer to the instruction pipeline as (i.e. respectively) (1) InRd, (2) Hashf, (3) HeadRd, (4) HistRd, (5, 6) Match1, Match2 and (7) Inaddr.

A block diagram illustrating a short string match in an instruction pipelined system implementing the fast history compression method in accordance with an embodiment of the present invention is shown in FIG. 2. The series of instruction sequences, generally referenced 30, comprises pipelined instruction sequences 32, 34, 36, 38, 40, 42, 44, 46 and a misprediction instruction sequence recovery group 48. In this example, there is a four character match (L=4), starting at data read in instruction sequence 36. The speculation method of the present invention had instruction sequences 38, 40 and 42 processing information that was included in the match, but theses sequences were started prior to the match being defined. Therefore the initial speculation was that no match would be found for instruction sequence 36. On the other hand, the misprediction recovery method of the present invention flags instruction sequences 38, 40 and 42, comprising misprediction sequence recovery group 48. Since data read in these sequences was included in the match detected in instruction sequence 36, these instruction sequences are ignored, and compression continues with instruction sequence 44.

A block diagram illustrating a medium string match in an instruction pipelined system implementing the fast history compression method in accordance with an embodiment of the present invention is shown in FIG. 3. The series of instruction sequences, generally referenced 50 comprises instruction sequences 52, 54, 56, 58, 60, 62, 64, 66, 68 and a misprediction sequence recovery group 69. In this example, there is a 10 character match between the input data and the history table, starting with instruction sequence 56. In this case the match is greater than the number of pipelined instructions, but less than the width of the history table. Therefore the match is still performed within the seven clock cycles of the pipelined instructions. Misprediction sequence recovery group 69 comprises instruction sequences 58, 60, 62, 64 and 66, since their data is included in the match. In this example, the instruction pipeline is effectively flushed, since the length of the match exceeds the number of relevant stages (but less than the width of the history table). Therefore stage 7 positions the input stream for instruction sequence 68 ten bytes after the starting input stream position for instruction sequence 56.

A block diagram illustrating a long string match in an instruction pipelined system implementing the fast history compression method in accordance with an embodiment of the present invention is shown in FIG. 4. The series of instruction sequences, generally referenced 70, comprises instruction sequences 72, 74, 76, 78, 80, 82, 84, 86, 88, 90, 92, 94, 96, 98 and a misprediction sequence recovery group 99. In this example, there is a match between the input data and the history table of 3.5 times the width of the history table (i.e. the width of the memory storing the history table), starting with instruction sequence 76. In this case the match is equal to or greater than both the number of pipelined instructions and the width of the history table. While the long string match is not completed within the seven clock cycles of the pipelined instructions, it is performed at a rate of greater than one character per cycle.

This example of a long string match begins with instruction sequence 76. Misprediction sequence 99 comprises pipelined instruction sequences started while instruction sequence 76 is executing. Therefore, any results from instruction sequences 78, 80, 82, 84 and 86 are ignored. At the end of executing instruction sequence 76, a match has been detected comprising (up to) the width of the memory (also called a line of memory) storing the history table. At this point, any additional matching characters (i.e. between the input data and the history table data) will be performed by comparing subsequent lines of memory from the history table against subsequent lines of memory from the input table.

To perform this check, the order of the pipelined instruction sequence is slightly altered. First, the next line of memory is read from both the history table (HistRd) and the input data (Inrd). Both reads are performed in a single clock cycle. During the next two clock cycles, Match1 and Match2 are performed. In this altered pipelined instruction sequence, entire lines of memory are retrieved and compared in three clock cycles. Since data read module 14 reads lines of memory, the input address of the read window (i.e. InAddr) is not recalculated at this time.

In the following clock cycles, instruction sequences 88, 90 and 92 perform successful speculation, where each instruction sequence processes an entire line of memory in both the input data and the history table. Instruction sequence 90 starts processing before instruction sequence 88 has detected a match, and instruction sequence 92 starts processing prior to instruction sequences 88 and 90 detecting matches. In this example, once Match2 has completed processing for instruction sequences 76, 88, 90 and 92, the match comprising a length of 3.5 times the history table (i.e. memory) width has been detected. In this example, the match of 3.5 times the memory width (i.e. of the history table) took 11 clock cycles.

The altered pipelined instruction sequence discussed supra also performs misprediction recovery. In this example, instruction sequences 94 and 96 start processing before instruction sequence 92 is finished. Since the end of the match between the input data and the history table is detected in instruction sequence 92, instruction sequences 94 and 96 are flagged (i.e. to be disregarded), and compression of the input data continues with instruction sequence 98.

Figure 5:
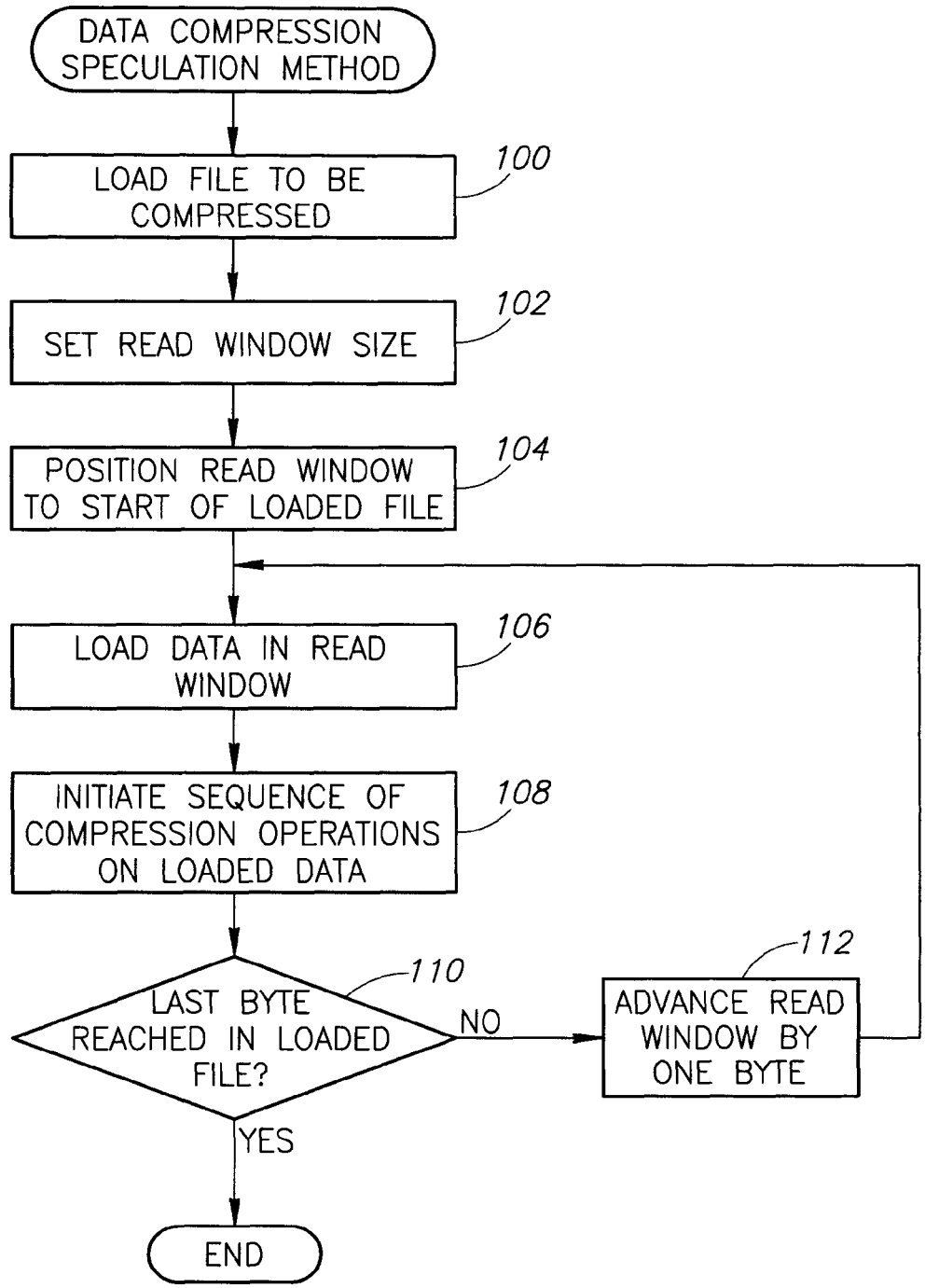
FIG. 5 is a flow diagram illustrating the fast data compression speculation method in accordance with an embodiment of the present invention.

A flow diagram illustrating the fast data compression speculation method in accordance with an embodiment of the present invention is shown in FIG. 5. First, the file to be compressed is loaded (step 100), the read window size is defined (step 102) and the input stream is positioned at the beginning of the file (step 104). Data is read (step 106) and a sequence of compression operations is performed on the data (step 108). If there is additional data to read (step 110), the input stream is advanced one byte (step 112) and the method of the present invention returns to step 106 while step 108 is still being performed.

Figure 6:
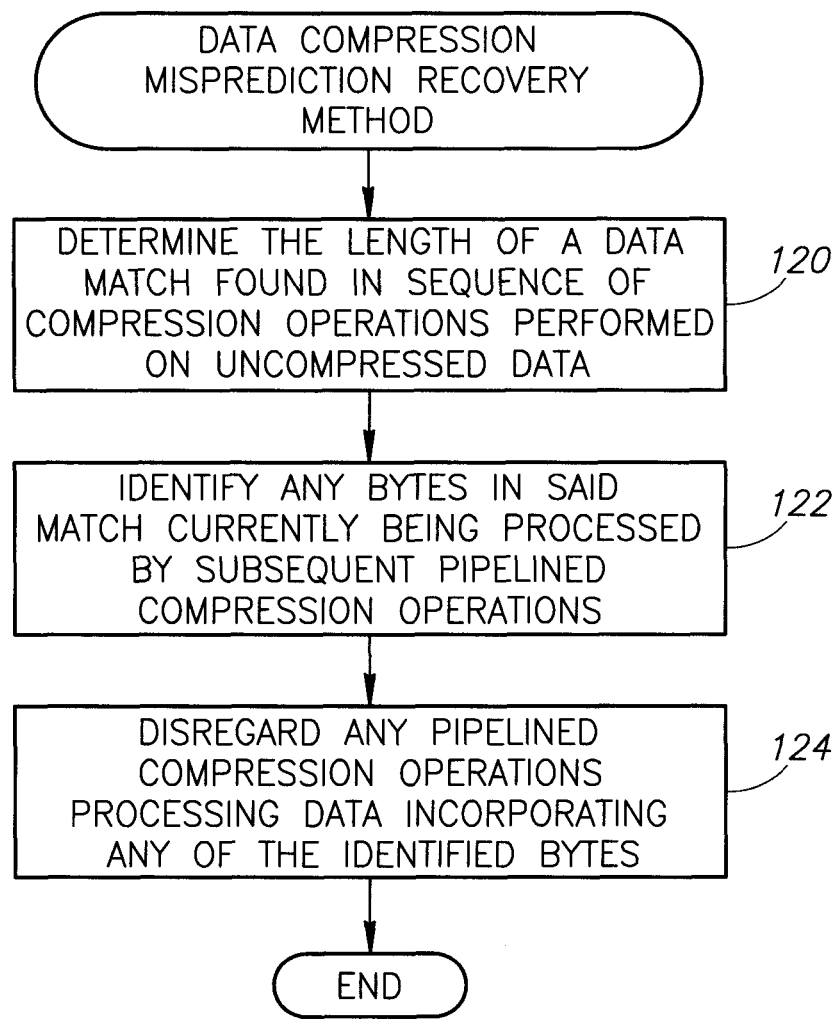
FIG. 6 is a flow diagram illustrating the fast data compression misprediction recovery method in accordance with an embodiment of the present invention.

A flow diagram illustrating the fast data compression misprediction recovery method in accordance with an embodiment of the present invention is shown in FIG. 6. After a match is found, the length of the match is determined (step 120). Any subsequent pipelined compression operations that are operating on bytes that were part of the match are identified (step 122), and these pipelined compression operations are flagged to be ignored (step 124).

The corresponding structures, materials, acts, and equivalents of all means or steps plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

It is intended that the appended claims cover all such features and advantages of the invention that fall within the spirit and scope of the present invention. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention.

What is claimed is:

1. A method of history based compression in a pipelined compression system, the method comprising:
    reading data by a system having at least a hardware memory, said data to be compressed from an input uncompressed data stream and stored in a hardware memory based history table in said system;
    speculating, by the system, that a current read input byte does not continue a string read previously, said speculation comprising starting subsequent read operations before a match is detected for a prior read operation;
    detecting a match between current read data and data read previously and stored in said history table;
    calculating, by the system, compressed data comprising a length distance pair and flagging data with a literal included in said current match currently in said pipeline as data to be ignored by said compression system;
    flushing, by the system, any read data currently in said pipeline included in said current match; and
    performing, by the system, one or more recovery actions in response to detecting that the current read input byte does continue the previously read string.

2. The method according to claim 1, wherein a first sequence and a second sequence of input data comprise an identical master sequence of instructions operating in a pipelined architecture in said compression system.

3. The method according to claim 2, wherein a first subset and second subset of input data are retrieved by said compression system via a read window comprising a fixed number of bytes.

4. The method according to claim 3, wherein after said first subset is retrieved via said read window, said read window advances one byte in said data in preparation to retrieve said second subset.

5. The method according to claim 3, wherein said history table comprises a third subset of said input data comprising a fixed number of bytes recently retrieved via said read window.

6. The method according to claim 5, wherein said history table is stored in a group consisting of a static random access memory array, a dynamic random access memory array and a register array.

7. The method according to claim 5, wherein said match comprises said fixed number of bytes retrieved via said read window in accordance with a corresponding number of sequential bytes stored in said history table.

8. The method according to claim 7, wherein said match further comprises one or more subsequent bytes in addition to said fixed number of bytes retrieved via said read window in said data in accordance with one or more subsequent corresponding additional bytes in said history table.

9. A pipelined history based compression system, comprising:
   a hardware memory based history table;
   a data read module operative to read data to be compressed from an input uncompressed data stream and storing said data in said history table;
   a speculation module, operative to speculate that a current read input byte does not continue a string read previously, said speculation comprising starting subsequent read operations before a match is detected for a prior read operation;
   a match detection module operative to attempt to find a match between current read data and data read previously and stored in said history table;
   a compression module operative to calculate, in response to the detected match, compressed data comprising a length-distance pair; flag data with a literal included in said current match currently in said pipeline as data to be ignored by said compression system; and flush read data currently in said pipeline included in said current match; and
   a misprediction recovery module operative to perform one or more recovery actions is speculation for the current byte is found to be incorrect.

10. The system according to claim 9, wherein said speculation module and said compression module are implemented in a pipelined architecture.

11. The system according to claim 9, wherein after retrieving current input data via a sliding read window, advancing said sliding read window by a byte to prepare for retrieval of a next input data.

12. The system according to claim 11, wherein said sliding read window retrieves a fixed number of sequential bytes from said data.

13. The system according to claim 9, wherein said history table comprises a fixed number of bytes of said data to be compressed recently retrieved by said speculation module.

14. The system according to claim 9, wherein said history table is stored in a group consisting of a static random access memory array, a dynamic random access memory array and a register array.

15. The system according to claim 9, wherein said match further comprises one or more additional bytes in addition to said current read data in accordance with one or more subsequent corresponding additional bytes in said history table.

16. A pipelined history based compression system, comprising:
   a read module, operative to retrieve data to be compressed from an input uncompressed data stream and storing said data in a history table;
   a compression module, operative to find a match between current read data and data previously read and stored in said history table; calculate compressed data comprising a length-distance pair; and flag data with a literal in said pipeline as data to be ignored by said compression system;
   a misprediction recovery module, operative to identify data read after the match is found, wherein said identified data comprises one or more bytes of data to be compressed that is identical to any matching data in said history table; and
   a speculation module operative to, in response to finding the match, flag data currently in the pipeline that was identified as the match; flush any read data in said pipeline included in said current match; speculate that a current input byte does not continue a string read previously, said speculation comprising starting subsequent read operations before a match is detected for a prior read operation, and perform one or more recovery actions on said compression system in response to detecting the speculation for the current byte is incorrect.

17. The system according to claim 16, wherein said read module, said compression module and said misprediction recovery module are implemented in a pipelined architecture.

18. The system according to claim 16, wherein said history table comprises a fixed number of bytes of said data to be compressed recently retrieved by said read module.

19. The system according to claim 16, wherein said history table is stored in a group consisting of a static random access memory array, a dynamic random access memory array and a register array.

* * * * *